(12) United States Patent
Brown et al.

(10) Patent No.: US 10,923,446 B1
(45) Date of Patent: Feb. 16, 2021

(54) INDIUM BUMP LIFTOFF PROCESS ON MICRO-MACHINED SILICON SUBSTRATES

(71) Applicant: United States of America as represented by the Administrator of NASA, Washington, DC (US)

(72) Inventors: Ari Brown, Greenbelt, MD (US); Vilem Mikula, Washington, DC (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/567,126

(22) Filed: Sep. 11, 2019

(51) Int. Cl.
*G03F 1/50* (2012.01)
*H01L 21/308* (2006.01)
*H01L 23/00* (2006.01)
*H01L 21/3213* (2006.01)
*H01L 21/027* (2006.01)

(52) U.S. Cl.
CPC .......... *H01L 24/11* (2013.01); *H01L 21/0276* (2013.01); *H01L 21/32139* (2013.01); *H01L 24/13* (2013.01); *H01L 2224/11001* (2013.01); *H01L 2224/1147* (2013.01); *H01L 2224/13109* (2013.01); *H01L 2924/01049* (2013.01)

(58) Field of Classification Search
None
See application file for complete search history.

(56) References Cited

U.S. PATENT DOCUMENTS

| | | | | |
|---|---|---|---|---|
| 2013/0273738 A1* | 10/2013 | Sakai | ............ | G03F 1/46 438/689 |
| 2014/0306233 A1* | 10/2014 | Nishi | ............ | H01L 21/3081 257/76 |
| 2019/0244815 A1* | 8/2019 | Libsch | ............ | H01M 4/0404 |

* cited by examiner

*Primary Examiner* — Angel Roman
(74) *Attorney, Agent, or Firm* — Christopher O. Edwards; Bryan A. Geurts; Helen M. Gaius (57) ABSTRACT

A metallic etching process includes applying an anti-reflection coating over a metallic superstrate, applying a dry film photoresist over the anti-reflection coating, removing exposed portions of the dry film photoresist exposing a portion of the anti-reflection coating, etching the exposed portions of the anti-reflection coating exposing portions of the metal superstrate, etching portions of the metallic superstrate not covered by the dry film photoresist, and removing the dry film photoresist and the anti-reflection coating leaving portions of the metallic superstrate. An indium bump liftoff process includes applying a positive photoresist, forming a liftoff mask by applying a dry film photoresist over the positive photoresist, removing exposed portions of the liftoff mask to expose a portion of a substrate, depositing an indium film over the exposed portion of the substrate and remaining portions of the liftoff mask, and removing remaining portions of the liftoff mask.

17 Claims, 7 Drawing Sheets

INDIUM BUMP LIFTOFF PROCESS ON MICRO-MACHINED SILICON SUBSTRATES

INVENTION BY GOVERNMENT EMPLOYEE(S) ONLY

The invention described herein was made by one or more employees of the United States Government, and may be manufactured and used by or for the Government for governmental purposes without the payment of any royalties thereon or therefor.

FIELD

The disclosed embodiments generally relate to micro-fabrication processes and more particularly to patterning micro-fabricated indium bumps on a micro-machined silicon substrate.

BACKGROUND

Flip chip hybridization is a microelectronics packaging and assembly process which connects an individual integrated circuit or monolithic integrated circuit, commonly referred to as a chip, directly to a substrate, eliminating the need for peripheral wire bonding. Conductive connections are made directly between the surface of the chip package and the substrate using conductive bumps made of a solder material. Flip chip assembly is also referred to as Direct Chip Attach (DCA), because the chip is attached directly to the substrate using the conductive bumps. Thermo-compression bonding techniques may be used to make the connections. Flip chip hybridization techniques provide lower lead resistance and a very reliable robust attachment because the conductive bonds are short and made of a structurally strong metal alloy. The techniques also allow for high density connections with very low profiles. In some applications, the substrate may be a silicon wafer on which circuitry is fabricated with through wafer vias placed directly on the wafer. This implementation presents challenges, primarily because the vias need to be filled with a polymer that is planar with the silicon substrate to within approximately a micron to allow for subsequent micron-scale lithography.

A common type of conductive interconnect solder bump for direct connection of integrated circuits and other devices to substrates, and for metallic contact between stacked circuit boards, is the indium bump. Indium bump technology is a unique process used mainly for flip-chip hybridization of semiconductor components, and has been part of the electronic interconnect process for about 40 years as part of a low cost assembly process. The use of indium is advantageous because of its cryogenic stability, thermal and electrical conductivity, superconductivity at cryogenic temperatures, self-adhesive and ductile nature, and relative ease of application.

Conventional methods used to pattern microscopic indium bumps include spin coating, spray coating, or shadow masking. Spin coating and spray coating may be used to realize microscopic indium bumps which can be photo-lithographically aligned with other features on a solid substrate. However, when a porous, micro-machined substrate is used in spin coating applications, the photoresist cannot be properly developed, prohibiting indium bump fabrication. In spray coating applications, the vias become clogged with photoresist, which then outgasses, which inhibits proper patterning of the vias and results in oxidation of the indium deposit. While shadow masking typically does not inhibit photoresist techniques, shadow masks need to either be placed in intimate contact with the substrate, which may cause damage, or may require an expensive direct "writing" technique in order to achieve one micron indium pattern alignment, typically achieved using photolithography techniques.

It would be advantageous to lithographically pattern indium bumps on micro-machined substrates in a manner that overcomes these and other disadvantages.

SUMMARY

In at least aspect of the disclosed embodiments, a metallic etching process includes applying an anti-reflection coating layer over a metallic superstrate on a first side of a semiconductor substrate, soft baking the anti-reflection coating layer, applying a dry film photoresist layer over the anti-reflection coating layer to form an etch mask, removing exposed portions of the dry film photoresist layer to expose a portion of the anti-reflection coating layer, etching the exposed portions of the anti-reflection coating layer to expose portions of the metal superstrate and create an etch mask, etching portions of the metallic superstrate not covered by the dry film photoresist layer, and removing the dry film photoresist layer and the anti-reflection coating layer to leave portions of the metallic superstrate.

The metallic etching process may include applying a layer of dicing tape to a second side of the semiconductor substrate before applying the anti-reflection coating layer and removing the layer of dicing tape from the second side before soft baking the anti-reflection coating layer.

The anti-reflection coating layer may include a fully cross linked polymer layer.

The anti-reflection coating layer may be removable by using oxygen plasma ashing.

The metallic etching process may include laminating the dry film photoresist layer over the anti-reflection coating layer by applying heat and pressure to conform the dry film photoresist layer to a topology of the anti-reflection coating layer.

The metallic etching process may include exposing portions of the dry film photoresist layer using a contact mask aligner.

Removing the exposed portions of the dry film photoresist layer to expose a portion of the anti-reflection coating layer may include removing the exposed portions of the dry film photoresist layer using a spray developer.

Etching exposed portions of the anti-reflection coating layer to expose portions of the supersubstrate may include etching the anti-reflection coating layer using an $O_2$ plasma in a reactive ion etcher.

Removing the dry film photoresist layer and the anti-reflection coating may leave portions of the metallic superstrate in the form of metallic traces.

In at least another aspect of the disclosed embodiments, an indium bump liftoff process may include applying a positive photoresist layer to a first side of a semiconductor substrate, soft baking the positive photoresist layer, forming a liftoff mask by applying a dry film photoresist layer over the positive photoresist layer, removing exposed portions of the liftoff mask to expose a portion of the substrate and creating an overhanging structure of the dry film photoresist layer, depositing an indium film over the exposed portion of the substrate and remaining portions of the liftoff mask, removing portions of the indium film from the remaining portions of the liftoff mask leaving a portion of the indium film within the overhanging structure of the dry film photoresist layer, and removing the remaining portions of the liftoff mask.

The indium bump liftoff process may include applying a layer of dicing tape to a second side of the semiconductor substrate before applying the positive photoresist layer; and removing the layer of dicing tape from the second side before soft baking the positive photoresist layer.

The positive photoresist layer may be a fully cross linked polymer layer.

The indium bump liftoff process may also include laminating the dry film photoresist layer over the positive photoresist layer by applying heat and pressure to conform the dry film photoresist layer to a topology of the positive photoresist layer.

The indium bump liftoff process may further include exposing portions of the dry film photoresist layer using a contact mask aligner.

Removing the exposed portions of the liftoff mask to expose a portion of the substrate and create an overhanging structure of the dry film photoresist layer may include removing the exposed portions of the dry film photoresist layer using a spray developer.

Removing the exposed portions of the liftoff mask to expose a portion of the substrate and create an overhanging structure of the dry film photoresist layer may further include etching portions of the positive photoresist layer to create the overhanging structure of the dry film photoresist layer.

The indium bump liftoff may still further include removing portions of the indium film from the remaining portions of the liftoff mask by thermally dissolving the indium portions being removed.

Removing the remaining portions of the liftoff mask may include leaving a portion of the indium film as indium bumps.

BRIEF DESCRIPTION OF THE DRAWINGS

The foregoing aspects and other features of the embodiments are explained in the following description, taken in connection with the accompanying drawings, wherein.

DETAILED DESCRIPTION

The disclosed embodiments are directed to pattern processes that overcome the above identified and other disadvantages. One or more embodiments include moving the vias to a separate substrate and using techniques that do not require filling the vias, which may result in relaxed lithography tolerances, a simplified fabrication process, and an increased through wafer via fabrication throughput. It should be understood that the terms wafer and substrate wafer may be used interchangeably throughout this disclosure.

At least one technical challenge associated with this approach generally includes the patterning of superconducting traces and indium bumps on the through wafer via substrate. At least one of the disclosed embodiments is directed to etching metallic traces on the via-containing substrate, using a multilayer etch mask. At least one layer may include an anti-reflection coating and at least one other layer may include a dry film photoresist layer, which may be laminated on the wafer. The dry film photoresist layer may be photo-lithographically patterned and the anti-reflection coating layer may be reactive ion etched. In contrast with a conventional, spin-on resist, the dry film photoresist layer may effectively cover the vias.

Another of the disclosed embodiments is directed to a process used to liftoff indium bumps on a via-containing substrate, using a multilayer liftoff mask. The substrate may be a silicon substrate, micro-machined using a deep reactive ion etcher. At least one layer of the liftoff mask may include a positive photoresist and at least one other layer may include a dry film photoresist layer. The liftoff mask may be patterned in a manner similar to the multilayer etch mask described above.

FIGS. 1A-1J illustrate an advantageous metallic etching process according to the disclosed embodiments. Although the disclosed embodiments will be described with reference to the embodiments shown in the drawings and described below, it should be understood that these could be embodied in many alternate forms. In addition, any suitable size, shape or type of elements or materials could be used. Furthermore, it should be understood that the dimensions of the various layers and structures in the Figures are not shown to scale in order to more clearly illustrate the etching process.

Figure 1A:
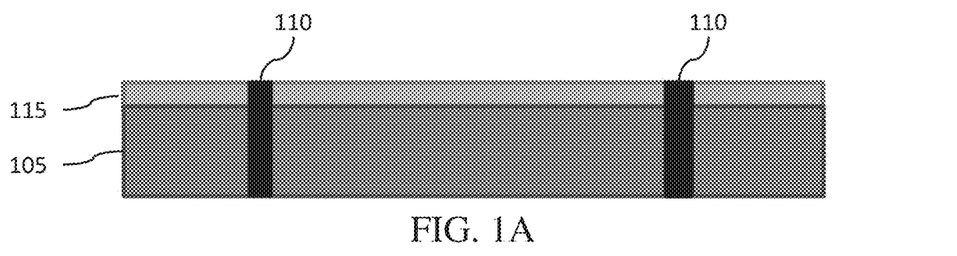
FIGS. 1A-1J illustrate an advantageous metallic etching process according to the disclosed embodiments.
Figure 1B:
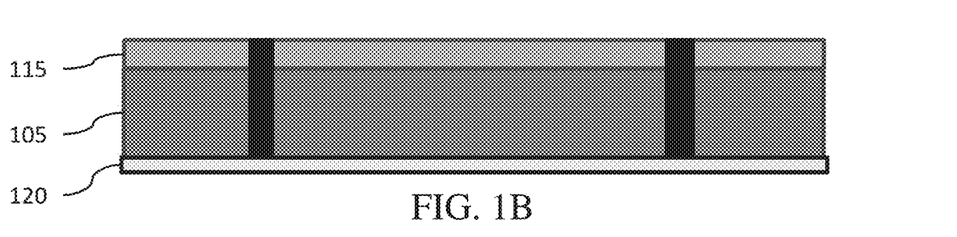
Figure 1C:
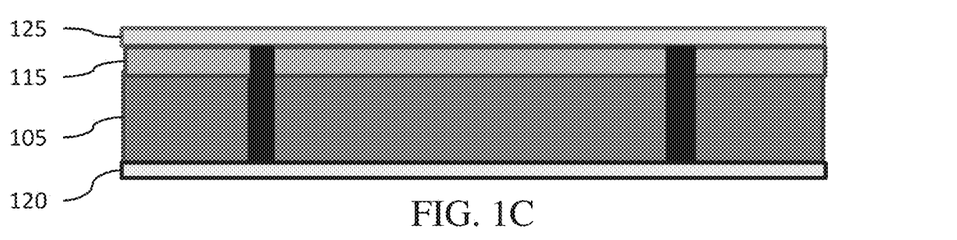
Figure 1D:
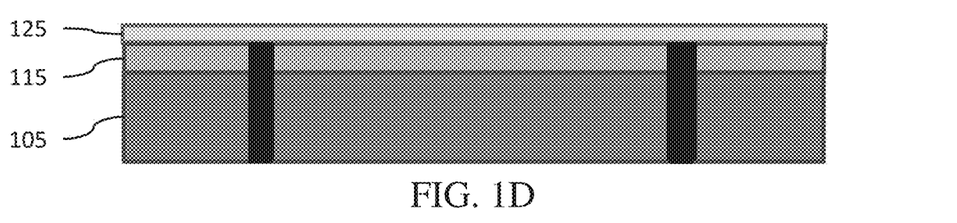

As shown in FIG. 1A the process may begin with a substrate 105, for example, a wafer, with one or more vias 110, and a metallic superstrate 115. A layer of dicing tape 120 may optionally be applied onto a bottom or second side of the substrate 105 to stabilize the substrate 105 or facilitate subsequent application of the anti-reflection coating layer 125 as illustrated in FIG. 1B. FIG. 1C shows an anti-reflection coating layer 125 that may be spun onto a top or first side of the substrate 105. The anti-reflection coating layer 125 may comprise a fully cross linked polymer layer that can be removed with oxygen plasma ashing, and may have a thickness of approximately 0.3-1.0 microns. As shown in FIG. 1D, the dicing tape layer 120, if applied, may then be removed and the anti-reflection coating layer 125 may be soft baked to anneal shear stresses, remove solvents, and to improve adhesion to the substrate 105.

Figure 1E:
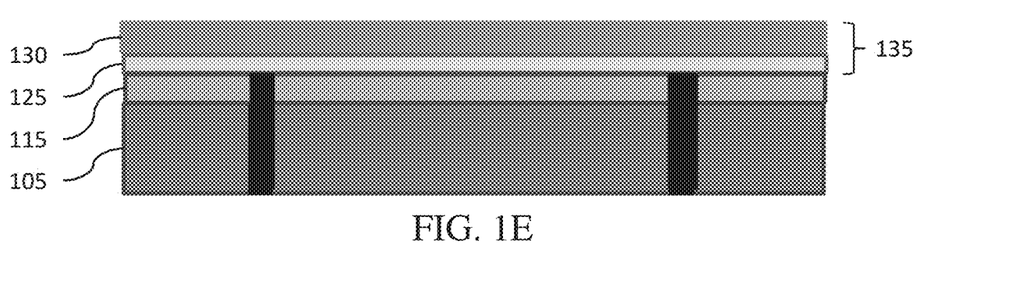

A dry film photoresist layer 130 may be applied over the positive photoresist layer 125 as shown in FIG. 1E to form an etch mask 135. In at least one embodiment, the dry film photoresist layer 130 may be laminated over the anti-reflection coating layer 125 using, for example, hot roll lamination techniques which may include applying heat and pressure to conform the dry film photoresist layer to the substrate surface topology.

Figure 1F:
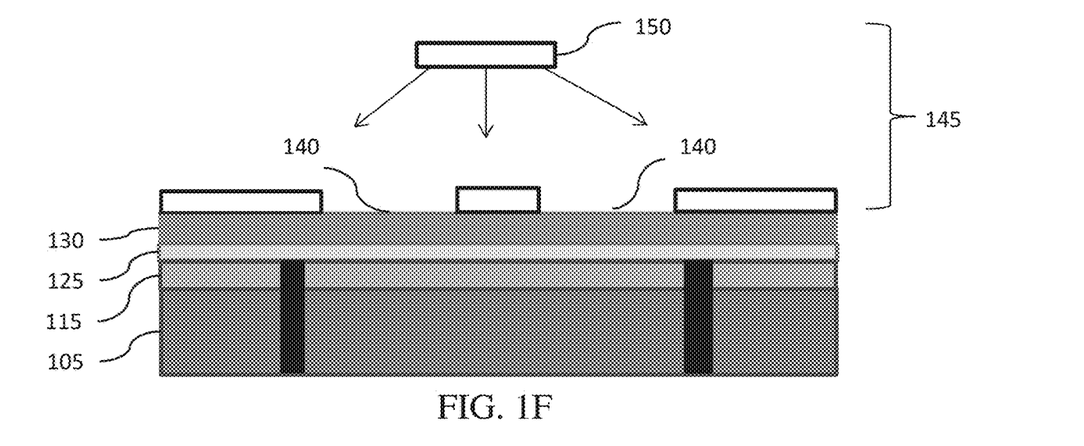
Figure 1G:
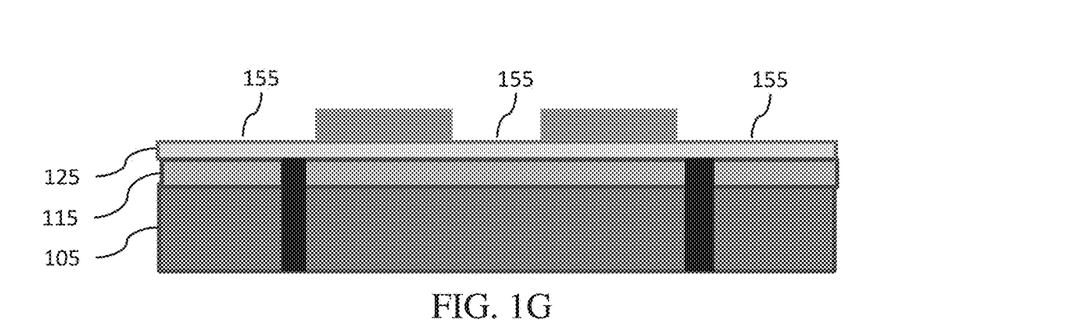

FIG. 1F illustrates that portions 140 of the dry film photoresist layer 130 may be exposed, for example, using a contact mask aligner 145 (shown schematically) with a UV light source 150. As shown in FIG. 1G, using for example, a spray developer, the unexposed areas 140 of the dry film photoresist layer 130 may be removed, exposing portions 155 of the anti-reflection coating layer 125. The spray developer process may include multiple steps, in which the dry photoresist layer 130 is coated with water prior to coating it with a basic developer, for example, a tetramethyl ammonium hydroxide-based developer. Multiple short applications of developer may be used in order to mitigate any undercut of the dry film photoresist layer 130, which may result in delamination of the dry photoresist layer 130.

Figure 1H:
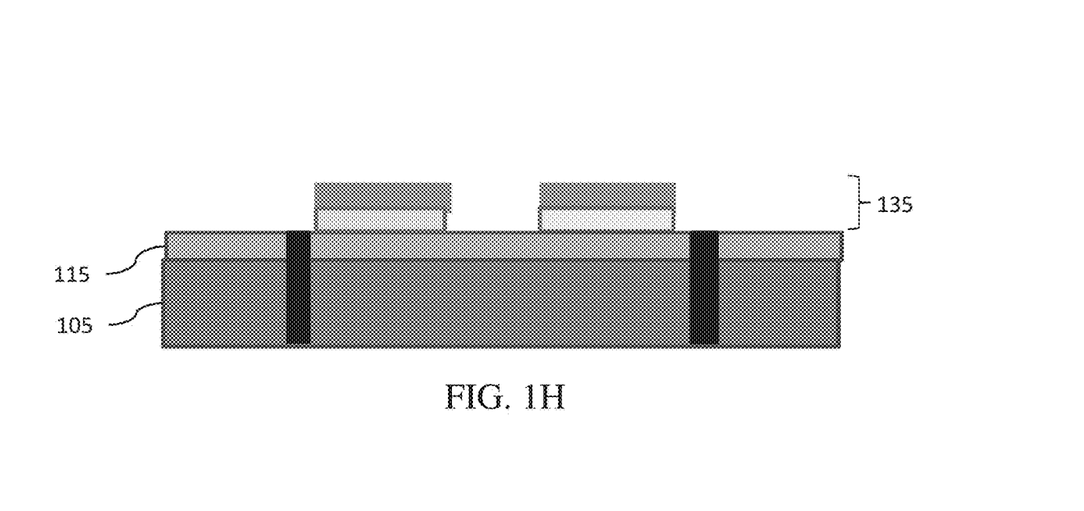

The unexposed portions 155 of the anti-reflection coating layer 125 may be etched to expose portions of the metallic superstrate 115 as shown in FIG. 1H. According to one or more embodiments, the anti-reflection coating layer 125 may be etched using an $O_2$ plasma in a reactive ion etcher.

Figure 1I:
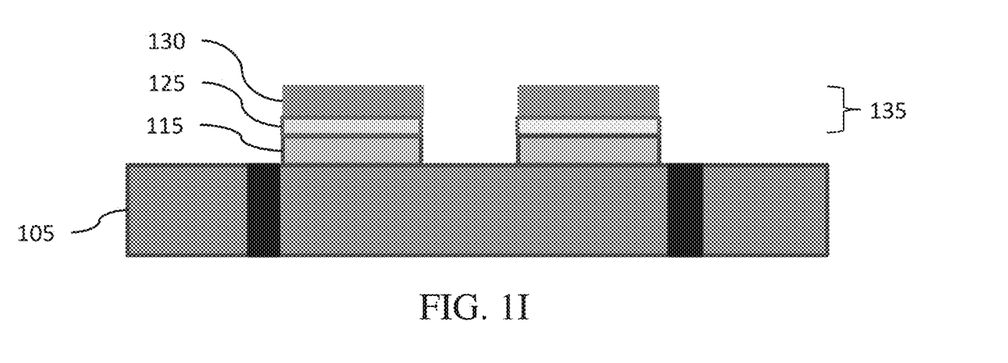
Figure 1J:
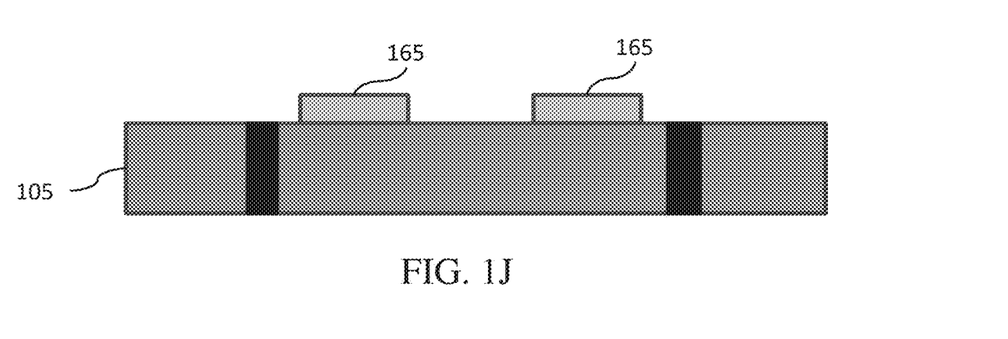

FIG. 1I shows that etching of the metallic superstrate 115 may occur in the regions which are not protected by the dry film photoresist layer 130. FIG. 1J shows the result of removing the dry film photoresist layer 130 and the anti-reflection coating layer 220, leaving portions of the metallic superstrate in the form of metallic traces.

The dry film photoresist layer 130 may become cross-linked as a result of the exposure process and may require a relaxation time, for example approximately 30 minutes before removal in order to avoid delamination of the dry film photoresist layer 130. The anti-reflection coating layer 125 may be removed by dissolving using one or more solvents. In some embodiments, an additional reactive ion etching step with oxygen ions may be required to remove undissolved portions of the anti-reflection coating layer 125. As mentioned above, it should be understood that the dimensions of the various layers and structures are not shown to scale in order to more clearly illustrate the liftoff process.

Figure 1K:
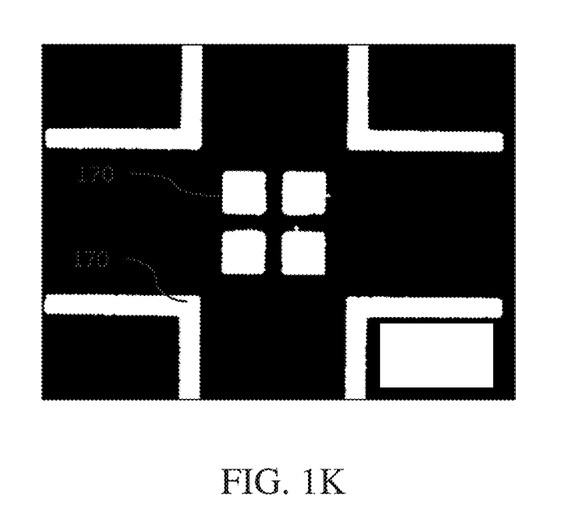
FIG. 1K shows a micrograph of a wafer etched using the disclosed metallic etching process.

FIG. 1K shows a micrograph of a wafer etched using the disclosed metallic etching process. The metallic etching process may reliably produce patterned features as small as approximately 20 microns. If a conservative 20 micron buffer region is provided around the patterned features, in this case superconducting TiN leads, the disclosed metallic etching process may permit the fabrication of bolometric detector arrays, with a backshort under grid architecture, with a filling fraction of approximately ~940/1000=94%.

FIGS. 2A-2K illustrate an advantageous liftoff process according to the disclosed embodiments. Although the disclosed embodiments will be described with reference to the embodiments shown in the drawings and described below, it should be understood that these could be embodied in many alternate forms. In addition, any suitable size, shape or type of elements or materials could be used. Furthermore, it should be understood that the dimensions of the various layers and structures in the Figures are not shown to scale in order to more clearly illustrate the liftoff process.

Figure 2A:
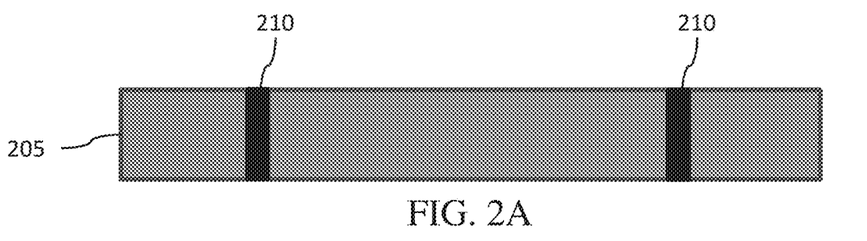
FIGS. 2A-2J illustrate an advantageous liftoff process according to the disclosed embodiments.
Figure 2B:
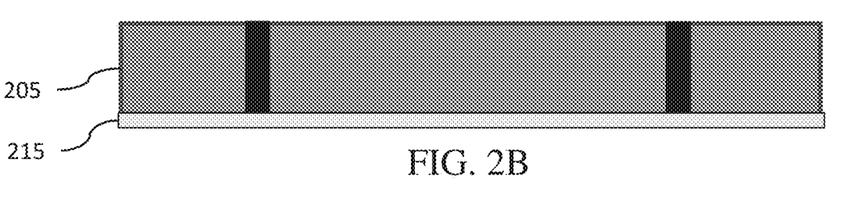
Figure 2C:
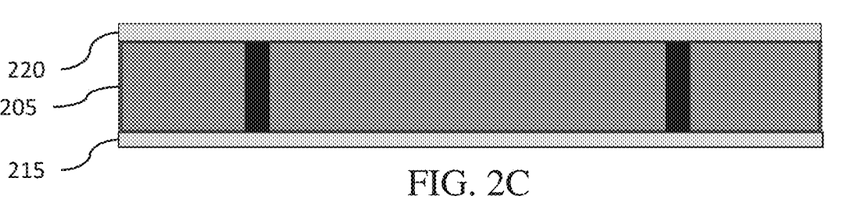
Figure 2D:
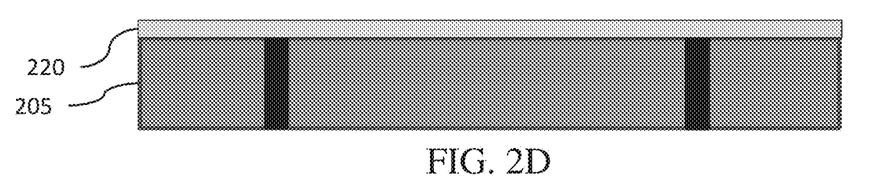

As shown in FIG. 2A the process may begin with a substrate 205, for example, a wafer, with one or more vias 210. A layer of dicing tape 215 may optionally be applied onto a bottom or second side of the substrate 205 to stabilize the substrate 205 or facilitate subsequent application of the positive photoresist coating layer 220 as illustrated in FIG. 2B. FIG. 2C shows a positive photoresist layer 220 that may be spun onto a top or first side of the substrate 205. The positive photoresist layer 220 may comprise a fully cross linked polymer layer soluble in one or more solvents, for example, acetone, N-Methyl-2-pyrrolidone (NMP), and Dimethyl sulfoxide (DMSO), and may have a thickness of approximately 1-2 microns. As shown in FIG. 2D, the dicing tape layer 215, if applied, may then be removed and the positive photoresist layer 220 may be soft baked to anneal shear stresses, remove solvents, and to improve adhesion to the substrate 205.

Figure 2E:
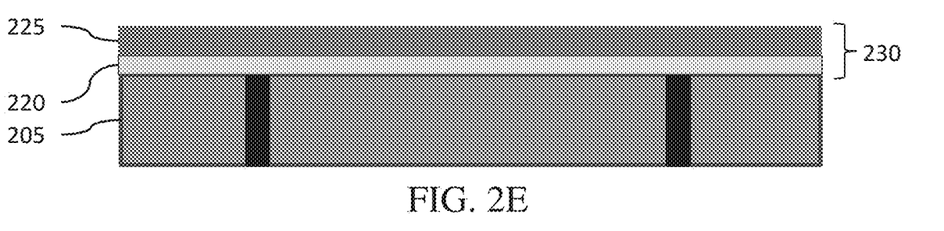

A layer of dry film photoresist 225 may be applied over the positive photoresist layer 220 as shown in FIG. 2E to form a liftoff mask 230. In at least one embodiment, the layer of dry film photoresist 225 may be laminated over the positive photoresist layer 220 using, for example, hot roll lamination techniques which may include applying heat and pressure to conform the dry film photoresist layer to the substrate surface topology.

Figure 2F:
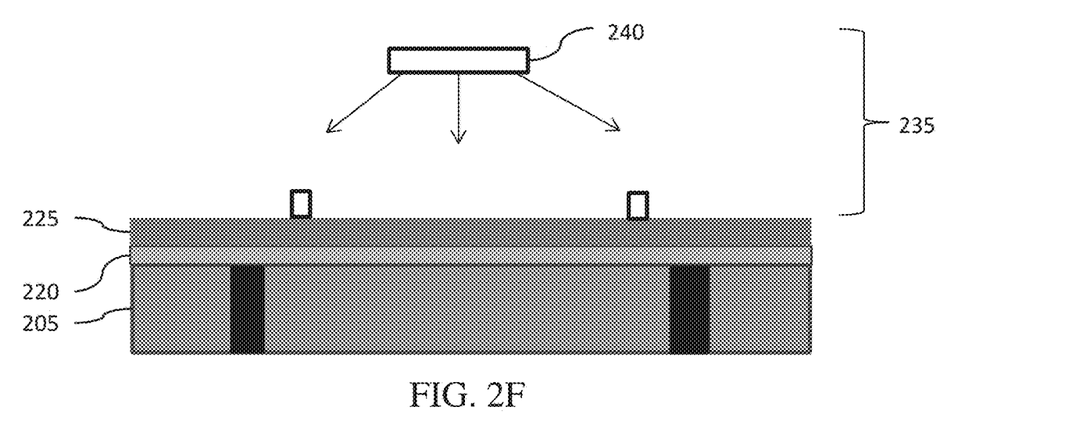
Figure 2G:
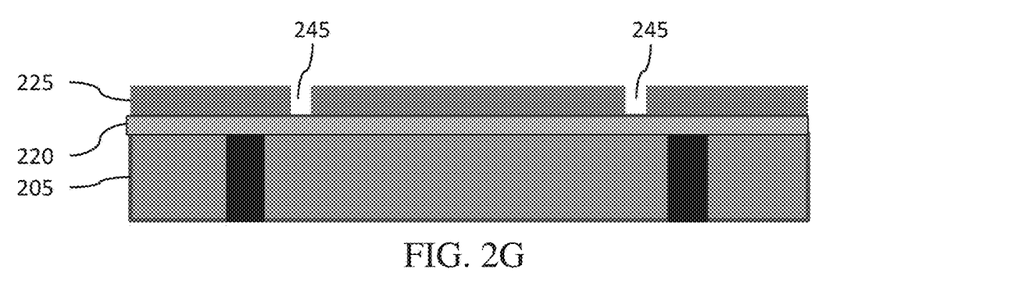

FIG. 2F illustrates that portions of the dry film photoresist layer 225 may be exposed, for example, using a contact mask aligner 235 (shown schematically) with a UV light source 240. As shown in FIG. 2G, using for example, a spray developer, the unexposed areas 245 of the dry film photoresist layer 225 may be removed, exposing portions 250 of the positive photoresist layer 220. The spray developer process may include multiple steps, in which the dry photoresist layer 225 is coated with water prior to coating it with a basic developer, for example, a tetramethyl ammonium hydroxide-based developer. Multiple short applications of developer are used in order to mitigate undercut of the dry photoresist layer 225, which may result in delamination of the dry photoresist layer 225.

Figure 2H:
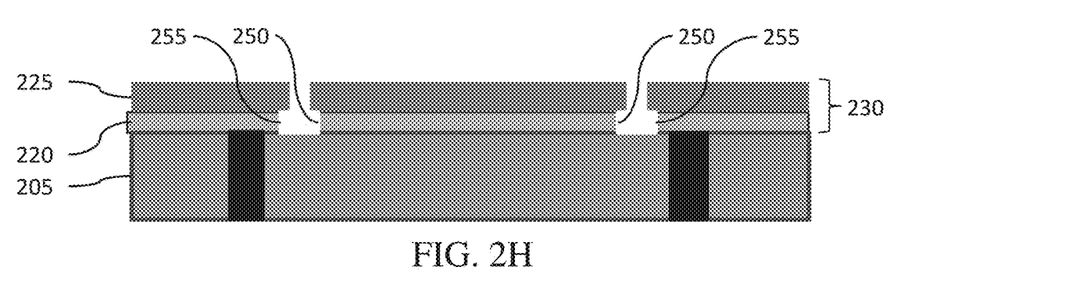

The exposed portions 250 of the positive photoresist layer 220 may be etched to expose portions of the substrate 205 and to create an overhanging structure 255 in the liftoff mask 230 as shown in FIG. 2H. According to one or more embodiments, the positive photoresist layer 220 may be etched using an $O_2$ plasma in a reactive ion etcher.

Figure 2I:
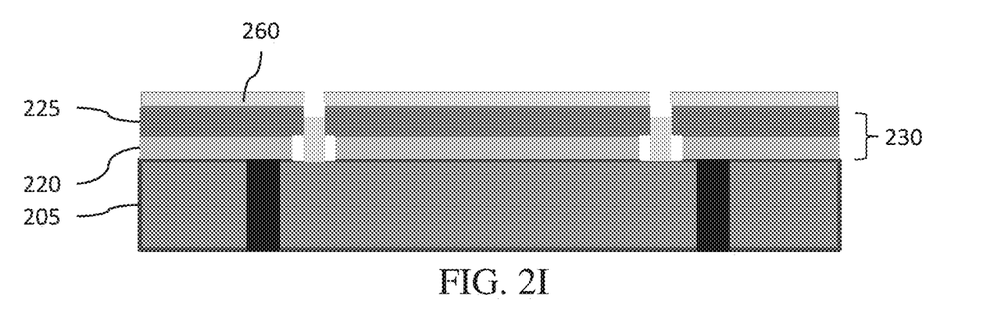
Figure 2J:
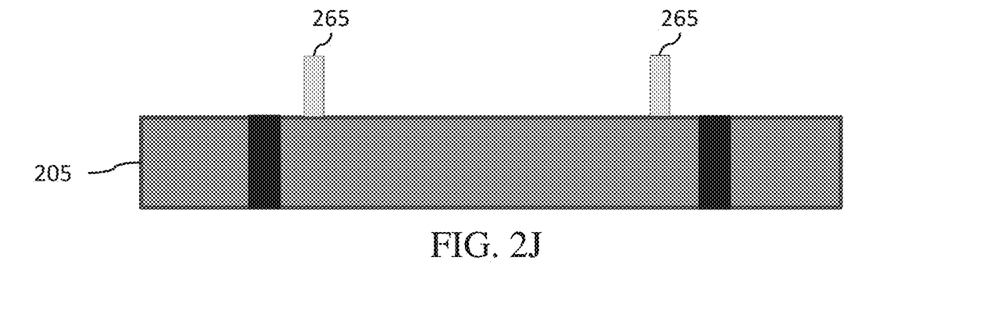

FIG. 2I shows that a deposition of indium 260 may be applied over the remaining portion of the dry film photoresist layer 225 and the exposed portion of the substrate 205. FIG. 2J shows the result of removing the dry film photoresist layer 225 and the positive photoresist layer 220, leaving the portion of the indium film 260 in the form of indium bumps 265.

The dry film photoresist layer 225 may become cross-linked as a result of the exposure process and may require a relaxation time, for example approximately 30 minutes before removal in order to avoid delamination of the dry film photoresist layer 225. The positive photoresist layer 220 may be removed by dissolving using one or more solvents. In some embodiments, an additional reactive ion etching step with oxygen ions may be required to remove undissolved portions of the positive photoresist layer 220. As mentioned above, it should be understood that the dimensions of the various layers and structures are not shown to scale in order to more clearly illustrate the liftoff process.

Figure 2K:
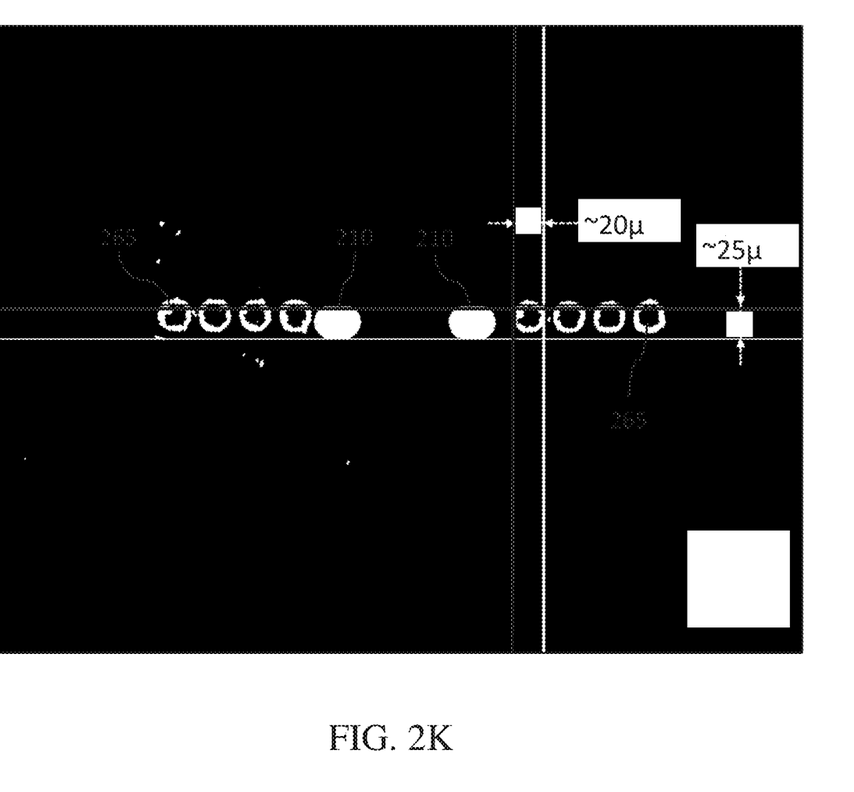
FIG. 2K shows a micrograph of a series of indium bumps produced using the disclosed liftoff process next to through wafer vias.

FIG. 2K shows a micrograph of a series of four-micron tall indium bumps next to two through wafer vias. The silicon wafer in which the vias were micro-machined may be approximately ~0.4 mm thick. In FIG. 2K the smallest indium bumps which can be reliably be lifted off a substrate containing through wafer vias may be as small as approximately 20 microns. As it is in the case of all patterned features fabricated on the through wafer via substrate, the size of the bumps will limit the optical filling fraction of the focal plane bolometric detector arrays. Placement of the bumps can be as close as five microns away from the vias, which illustrates the versatility of this process.

At least one of the unique aspects of this innovation is that it permits the fabrication of microscopic (<20 microns in diameter) indium bumps on substrates having microscopic (<50 microns in diameter) vias.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

The invention claimed is:

1. A metallic etching process comprising:
applying an anti-reflection coating layer over a metallic superstrate on a first side of a semiconductor substrate;
soft baking the anti-reflection coating layer;
applying a dry film photoresist layer over the anti-reflection coating layer to form an etch mask;
removing exposed portions of the dry film photoresist layer to expose a portion of the anti-reflection coating layer;
etching the exposed portions of the anti-reflection coating layer to expose portions of the metal superstrate and create an etch mask;
etching portions of the metallic superstrate not covered by the dry film photoresist layer; and
removing the dry film photoresist layer and the anti-reflection coating layer to leave portions of the metallic superstrate.

2. The metallic etching process of claim 1, further comprising:
applying a layer of dicing tape to a second side of the semiconductor substrate before applying the anti-reflection coating layer; and
removing the layer of dicing tape from the second side before soft baking the anti-reflection coating layer.

3. The metallic etching process of claim 1, wherein the anti-reflection coating layer comprises a fully cross linked polymer layer.

4. The metallic etching process of claim 1, wherein the anti-reflection coating layer is removable by using oxygen plasma ashing.

5. The metallic etching process of claim 1, comprising laminating the dry film photoresist layer over the anti-reflection coating layer by applying heat and pressure to conform the dry film photoresist layer to a topology of the anti-reflection coating layer.

6. The metallic etching process of claim 1, comprising exposing portions of the dry film photoresist layer using a contact mask aligner.

7. The metallic etching process of claim 1, wherein removing the exposed portions of the dry film photoresist layer to expose a portion of the anti-reflection coating layer comprises removing the exposed portions of the dry film photoresist layer using a spray developer.

8. The metallic etching process of claim 1, wherein etching exposed portions of the anti-reflection coating layer to expose portions of the supersubstrate comprises etching the anti-reflection coating layer using an $O_2$ plasma in a reactive ion etcher.

9. The metallic etching process of claim 1, wherein removing the dry film photoresist layer and the anti-reflection coating layer leaves portions of the metallic superstrate in the form of metallic traces.

10. An indium bump liftoff process comprising:
applying a positive photoresist layer to a first side of a semiconductor substrate;
soft baking the positive photoresist layer;
forming a liftoff mask by applying a dry film photoresist layer over the positive photoresist layer;
removing exposed portions of the liftoff mask to expose a portion of the substrate and creating an overhanging structure of the dry film photoresist layer;
depositing an indium film over the exposed portion of the substrate and remaining portions of the liftoff mask;
removing portions of the indium film from the remaining portions of the liftoff mask leaving a portion of the indium film within the overhanging structure of the dry film photoresist layer; and
removing the remaining portions of the liftoff mask.

11. The indium bump liftoff process of claim 10, further comprising:
applying a layer of dicing tape to a second side of the semiconductor substrate before applying the positive photoresist layer; and
removing the layer of dicing tape from the second side before soft baking the positive photoresist layer.

12. The indium bump liftoff process of claim 10, wherein the positive photoresist layer comprises a fully sacrificial layer.

13. The indium bump liftoff process of claim 10, comprising laminating the dry film photoresist layer over the positive photoresist layer by applying heat and pressure to conform the dry film photoresist layer to a topology of the positive photoresist layer.

14. The indium bump liftoff process of claim 10, comprising exposing portions of the dry film photoresist layer using a contact mask aligner.

15. The indium bump liftoff process of claim 10, wherein removing the exposed portions of the liftoff mask to expose a portion of the substrate and create an overhanging structure of the dry film photoresist layer comprises removing the exposed portions of the dry film photoresist layer using a spray developer.

16. The indium bump liftoff process of claim 15, wherein removing the exposed portions of the liftoff mask to expose a portion of the substrate and create an overhanging structure of the dry film photoresist layer further comprises etching portions of the positive photoresist layer to create the overhanging structure of the dry film photoresist layer.

17. The indium bump liftoff process of claim 10, wherein removing the liftoff mask comprises leaving a portion of the indium film as indium bumps.

* * * * *